United States Patent
Nilson (10) Patent No.: US 10,261,537 B2
(45) Date of Patent: Apr. 16, 2019

(54) WIDE SUPPLY RANGE PRECISION STARTUP CURRENT SOURCE

(71) Applicant: AVNERA CORPORATION, Beaverton, OR (US)

(72) Inventor: Christopher D. Nilson, San Jose, CA (US)

(73) Assignee: AVNERA CORPORATION, Beaverton, OR (US)

( * ) Notice: Subject to any disclaimer, the term of this patent is extended or adjusted under 35 U.S.C. 154(b) by 0 days.

(21) Appl. No.: 15/955,620

(22) Filed: Apr. 17, 2018

(65) Prior Publication Data

US 2018/0232000 A1    Aug. 16, 2018

Related U.S. Application Data

(63) Continuation-in-part of application No. 15/078,894, filed on Mar. 23, 2016, now Pat. No. 9,946,277.

(51) Int. Cl.
*G05F 1/46* (2006.01)
*G05F 3/16* (2006.01)
*H03K 17/687* (2006.01)

(52) U.S. Cl.
CPC ............ *G05F 3/16* (2013.01); *H03K 17/687* (2013.01); *G05F 1/468* (2013.01)

(58) Field of Classification Search
CPC ... G05F 1/468; G05F 3/30; G05F 3/02; G05F 3/08; H02M 1/36
USPC ..................................... 323/311–317; 363/49
See application file for complete search history.

(56) References Cited

U.S. PATENT DOCUMENTS

| 5,084,665 A | 1/1992 | Dixon et al. |
| 6,002,242 A | 12/1999 | Migliavacca |
| 6,351,178 B1* | 2/2002 | Ooishi .................. G11C 5/143 323/313 |
| 6,509,855 B1* | 1/2003 | Cable .................. H03M 1/002 323/316 |

(Continued)

FOREIGN PATENT DOCUMENTS

| EP | 2273339 A1 | 1/2011 |
| FR | 2767976 A1 | 3/1999 |

OTHER PUBLICATIONS

International Search Report and Written Opinion issued in International Application No. PCT/US2017/023891, dated Jun. 21, 2017, 12 pages.

*Primary Examiner* — Alex Torres-Rivera
(74) *Attorney, Agent, or Firm* — Miller Nash Graham & Dunn LLP (57) ABSTRACT

A start-up circuit for a bandgap reference voltage generator circuit, including a first native transistor with a drain connected to a supply voltage of the bandgap reference voltage generator circuit and a source connected to a gate of the first native transistor; a low voltage transistor with a source connected to ground, a drain connected to the source of the first native transistor, and a gate connected to a resistor; a second native transistor with a source connected to the resistor, a gate connected to the source of the first native transistor; a high voltage transistor with a drain connected to a drain of the second native transistor and a source connected to the supply voltage; and a transistor with a gate connected to the gate of the first high voltage transistor and a drain which provides a start-up current for the bandgap reference voltage generator circuit.

13 Claims, 6 Drawing Sheets

(56) References Cited

U.S. PATENT DOCUMENTS

| | | | |
|---|---|---|---|
| 6,853,164 B1 | 2/2005 | Prinz et al. | |
| 7,531,999 B2 | 5/2009 | Chang | |
| 8,013,588 B2* | 9/2011 | Imura | G05F 3/242 |
| | | | 323/313 |
| 2006/0038550 A1* | 2/2006 | Nazarian | G05F 3/205 |
| | | | 323/315 |
| 2006/0044053 A1 | 3/2006 | Tang et al. | |
| 2006/0197584 A1 | 9/2006 | Hsu | |
| 2007/0164722 A1* | 7/2007 | Rao | G05F 3/262 |
| | | | 323/315 |
| 2007/0194770 A1 | 8/2007 | Kalyanaraman | |
| 2008/0231248 A1 | 9/2008 | Hung | |
| 2010/0164609 A1* | 7/2010 | Yoo | G05F 3/30 |
| | | | 327/542 |
| 2010/0181987 A1* | 7/2010 | Sicard | G05F 3/30 |
| | | | 323/315 |
| 2010/0278002 A1 | 11/2010 | Chen et al. | |
| 2011/0006749 A1 | 1/2011 | Stellberger et al. | |
| 2011/0050197 A1* | 3/2011 | Yuasa | G05F 3/242 |
| | | | 323/313 |
| 2011/0127989 A1 | 6/2011 | Hikichi et al. | |
| 2011/0169561 A1* | 7/2011 | Chu | G05F 3/30 |
| | | | 327/539 |
| 2014/0312875 A1* | 10/2014 | Nascimento | G05F 3/30 |
| | | | 323/314 |
| 2017/0131736 A1 | 5/2017 | Acar et al. | |

\* cited by examiner

WIDE SUPPLY RANGE PRECISION STARTUP CURRENT SOURCE

CROSS-REFERENCE TO RELATED APPLICATIONS

This application is a continuation-in-part of co-pending U.S. Non-provisional patent application Ser. No. 15/078,894, filed Mar. 23, 2016, entitled "WIDE SUPPLY RANGE PRECISION STARTUP CURRENT SOURCE," the disclosure of which is incorporated herein by reference in its entirety.

TECHNICAL FIELD

This disclosure relates to a self-biased current source that combines a very low minimum supply voltage with a very high maximum supply voltage without danger of oxide damage.

BACKGROUND

Figure 1:
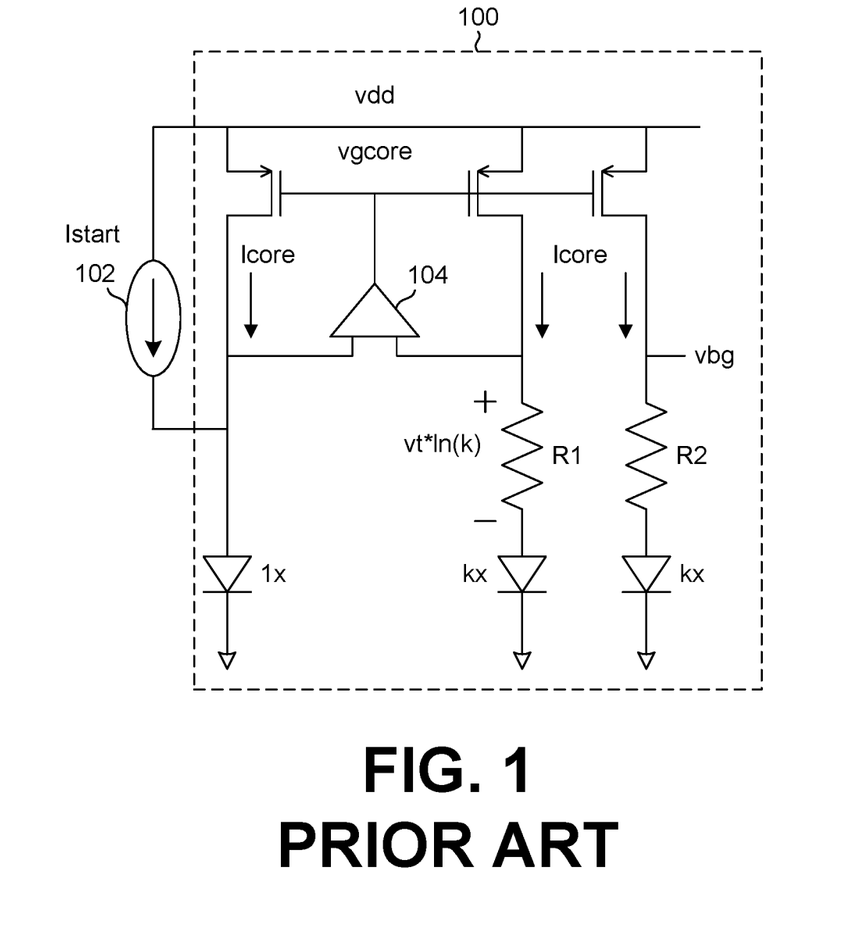
FIG. 1 illustrates a bandgap circuit with a startup current source.

Bandgap reference voltage circuits are used to provide stable reference voltages over wide variations in operating temperatures. A common bandgap reference voltage circuit 100 is shown in FIG. 1. The bandgap circuit 100 is typically coupled with a start-up circuit 102. Typically, the main purpose of the start-up circuit 102 is to start the bandgap circuit 100. The start-up circuit 102 may ensure that the bandgap circuit 100 operates within a valid operating range, avoiding any undesired stable state. As a source voltage vdd ramps from zero volts to a final value, the bandgap circuit 100 should reach its desired final value as well.

The amplifier 104 driving the voltage vgcore settles when both inputs of the amplifier 104 are at the same voltage. This occurs when the drop across resistor R1 in FIG. 1 is equal to the difference between the lx and kx diode voltages, i.e.:

$$Icore*R1 = vt*\ln(k) \quad (1)$$

The voltage vbg has a zero temperature coefficient when $$Icore*R2 + Vdiode_{kx} \approx 1.26V \quad (2)$$

One of the start-up circuit's 102 functions is to ensure that the bandgap circuit 100 does not remain at a zero-current stable state. To avoid a zero-current stable state, the start-up circuit 102 is provided to initialize the loop, then is effectively removed to avoid an offset error after the bandgap circuit 100 has stabilized.

Embodiments of the invention address these and other limitations in the prior art.

DETAILED DESCRIPTION

Figure 2:
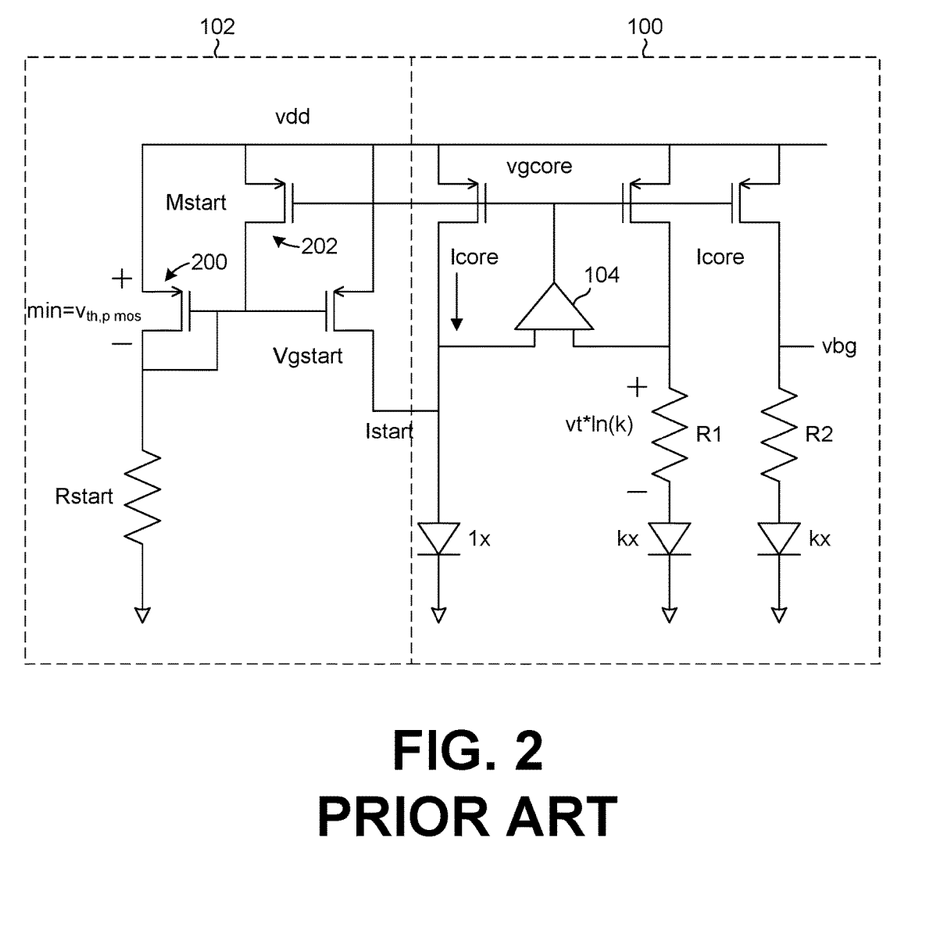
FIG. 2 illustrates a typical startup current implementation.

FIG. 2 illustrates the bandgap circuit 100 of FIG. 1 with a typical startup circuit 102. The startup circuit 102 can ignore the minimum supply required by the bandgap circuit 100, and the current Istart starts to flow when the voltage vdd reaches the threshold voltage Vth of the p-channel metal oxide semiconductor field effect (pmos) transistor 200, and will increase linearly thereafter with the voltage vdd. When the voltage vgcore is significant, transistor 202 turns on and pulls the voltage Vgstart to the voltage vdd which shuts off current Istart.

This startup circuit 102, however, assumes that the current Istart is smaller than the current Icore of the bandgap circuit 202, and therefore requires a large resistor Rstart, typically several Megohms. Furthermore, even when startup circuit 102 is off, current continues to flow in Rstart. Therefore, although this startup circuit 102 has a good minimum supply requirement, the startup circuit 102 has poor supply stability, overall power consumption, and area characteristics.

Figure 3:
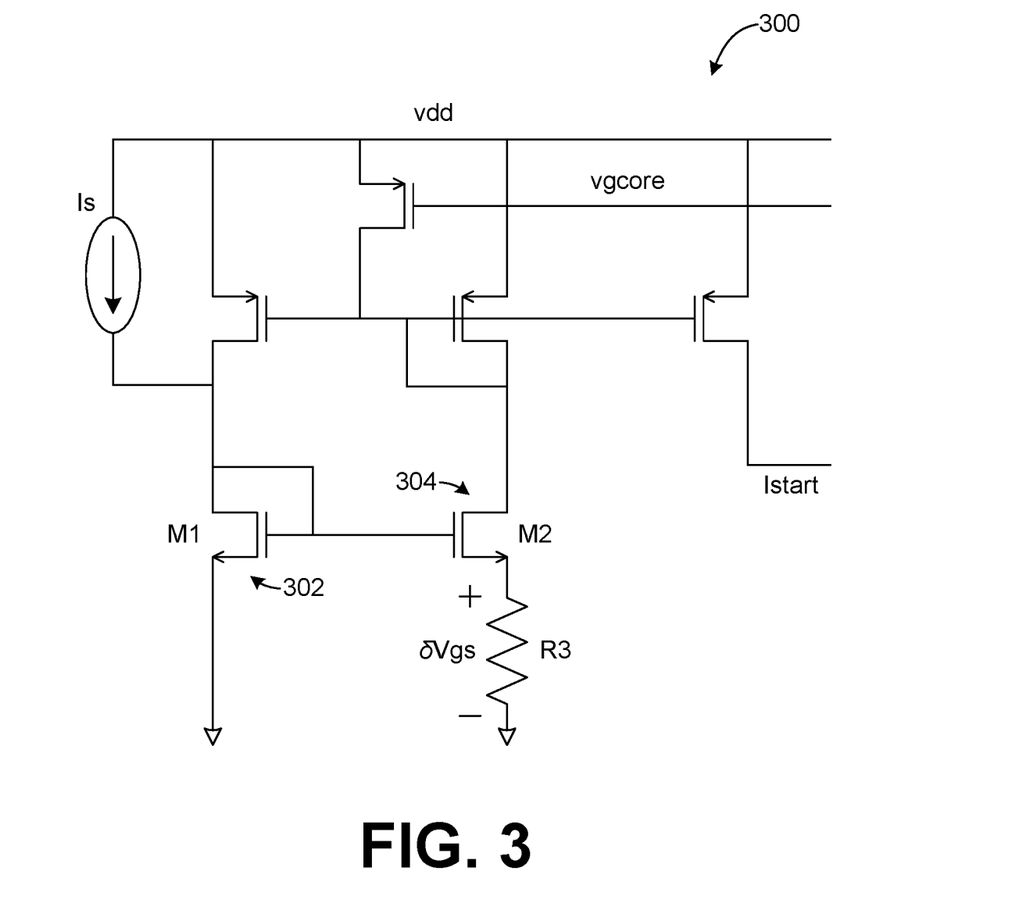
FIG. 3 illustrates an alternate current source circuit with a startup current Istart.

An alternative startup circuit 300 is shown in FIG. 3. Equal currents are forced through transistors 302 and 304, which may be different sizes. The difference in the voltage Vgs is forced across the resistor R3, and the resulting current Istart is much more stable versus the supply voltage and requires less resistance at R3. The minimum supply voltage for this startup circuit 300 is slightly larger than a threshold voltage Vt of the pmos transistor 200. The current Istart is shut off when the voltage vgcore stabilizes, as with the startup circuit 102 shown in FIG. 2. The drawback of this design is that the transistors 302 and 304 loops have a zero-current state that must be avoided with its own startup current Is.

Figure 4:
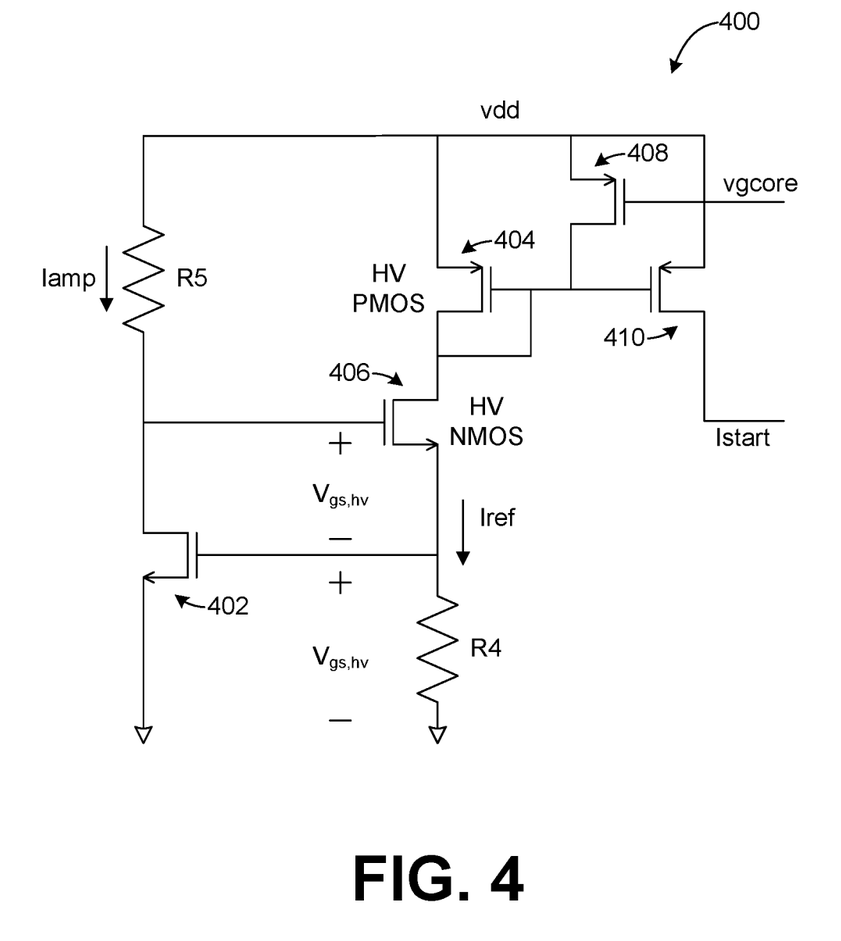
FIG. 4 illustrates a self-starting current source circuit.

FIG. 4 illustrates another start-up circuit 400. This start-up circuit 400 includes a high voltage transistor 402, with its source connected to ground, and the gate connected to a resistor R4. The drain of the transistor 402 is connected to a resistor R5. Resistor R5 is connected to the supply voltage vdd and a source of a high voltage pmos transistor 404. The drain of the pmos transistor 404 is connected to the drain of a high voltage n-channel MOSFET (nmos) transistor 406. The gate of the nmos transistor 406 is connected to the drain of transistor 406 and the source of the nmos transistor 406 is connected to the gate of the transistor 402 and the resistor R4. The current Iref flows from the source of the nmos transistor 406 through the resistor R4.

The gate of the pmos transistor 404 is connected to its own drain and also to the drain of the high voltage transistor 408 and the gate of transistor 410. The gate of transistor 408 is connected to voltage vgcore from the bandgap reference circuit 100. The source of the transistor 408 is connected to the source of the transistor 410 through supply voltage vdd. The start-up current Istart is then supplied through the drain of the transistor 410.

Start-up circuit 400 has no zero-current state, but requires more resistance at R4 compared to R3 in the previous circuit 300, since current Iref equals the gate source voltage Vgs, instead of δVgs, divided by R4. For typical maximum supply requirements, e.g. greater than 1.2V, all transistors in circuit 400 must be high-voltage types, which have correspondingly large Vth, further increasing the typical value of R4. Start-up circuit 400 also requires a sizable resistor R5 to bias the leftmost branch of the start-up circuit 400. Current Tamp through resistor R5 is supply voltage-dependent, although current Istart is not. The minimum supply requirement for current Tamp is approximately two times the threshold voltage of the nmos transistor 406. Thus, this current generator has most of the disadvantages of the startup circuit 102 discussed above and shown in FIG. 2.

Figure 5:
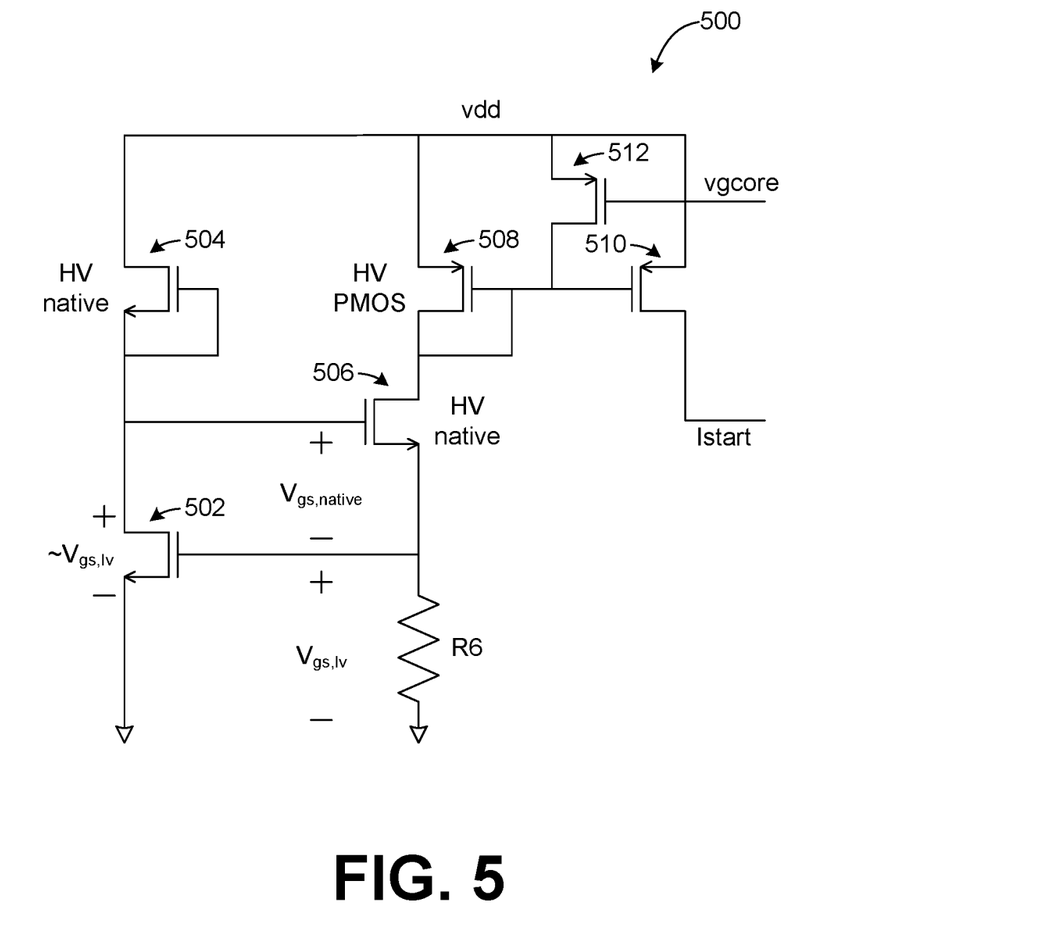
FIG. 5 illustrates a wide supply range precision startup current source.

FIG. 5 illustrates a wide supply range precision startup current source circuit 500 according to embodiments of the invention. The start-up circuit 500 of FIG. 5 generates the current Istart at the smallest possible power consumption and power supply voltage. The shortcomings of the start-up circuit 400 in FIG. 4 are addressed by using native transistors, as will be discussed in more detail below. Native transistors have a threshold voltage Vth near 0V, or even a slightly negative voltage.

The start-up circuit 500 shown in FIG. 5 includes a low voltage nmos transistor 502, with its source connected to ground, and the drain connected to a high voltage nmos native transistor 504. The gate of the native transistor 504 is connected to its source. The gate of the transistor 502 is connected to a resistor R6. Resistor R6 is connected to ground and a source of another high voltage native transistor 506. The drain of the native transistor 506 is connected to the drain of a pmos transistor 508. The gate of the pmos transistor 508 is connected to its own drain and the gate of the native transistor 506. The source of native transistor 504 and the source of the pmos transistor 508 are connected to the supply voltage vdd.

The gate of the pmos transistor 508 is also connected to the gate of transistor 510 and the drain of transistor 512. The gate of transistor 512 is connected to voltage vgcore from the bandgap reference circuit 100. The source of the transistor 512 is connected to the supply voltage vdd. The start-up current Istart is then supplied through the drain of the transistor 510. In one embodiment of circuit 500, typical sizes for these PMOS transistors are W/L=8 um/1 um.

A native transistor with the gate and source shorted, such as transistor 504, behaves as an ordinary transistor would with its gate to source voltage Vgs near its threshold voltage Vth, i.e., its current is roughly constant and its output resistance is high. Furthermore, for such a native transistor, current begins to flow at a drain to source voltage Vds of nearly 0V. Self-biased current sources may be made such as the one formed by transistor 504 in the left-most branch of FIG. 5. This current provides bias to the amplifier formed by transistor 502. The drawback of using native transistors in this way, however, is that gate to source voltage Vgs is fixed at 0V, while the threshold voltage Vth varies over the process and temperature of the circuit 500, thus, the current is poorly controlled. Simulations over all conditions predict that the current varies over nearly two orders of magnitude.

However, the start-up circuit 500 of FIG. 5 does not require precise current control in the amplifier branch, and though the startup time may vary since it is inversely proportional to the amplifier bias current, load capacitance in the amplifier branch is small, making the maximum startup time for the start-up circuit 500 similarly short, typically less than 100 uS. The start-up circuit 500 is sized so that even with large variations in current, its maximum current value is small compared to the overall current budget, which is commonly a few uA.

Native transistors may also be used in the feedback branch driving resistor R5, as discussed above. In this feedback branch, the native transistor 506 serves exactly the same purpose as the counterpart transistor 406 in FIG. 4, but requires a gate to source voltage of 0V Vgs to do so. The start-up circuit 400 uses a supply voltage Vdd of approximately two times the threshold voltage of transistor 402, as mentioned above, to start providing current. However, the circuit in FIG. 5 only uses a supply voltage Vdd of approximately the threshold voltage of transistor 502.

Furthermore, the drain to source voltage Vds of the amplifier transistor 502 is constrained to equal its gate to source voltage Vgs, which results in an improvement in supply range due to the native nmos feedback device, since the native transistor 504's Vgs is nominally 0V. Therefore it is safe to use a low-voltage transistor 502 for the amplifier, even for a large supply voltage vdd. Resistor R6 may be smaller for the same reference current, since the voltage across resistor R6 is the gate to source voltage of the transistor 502. A constraint to accommodate large supply voltages is that high-voltage pmos transistors must be used for the output mirror, and if no native pmos devices are available, the pmos threshold voltage Vth can degrade the minimum supply voltage. Even so, by applying the native transistors to a standard current reference design, large improvements in minimum supply voltage, bias current supply variation, and bias current overhead are made.

Figure 6:
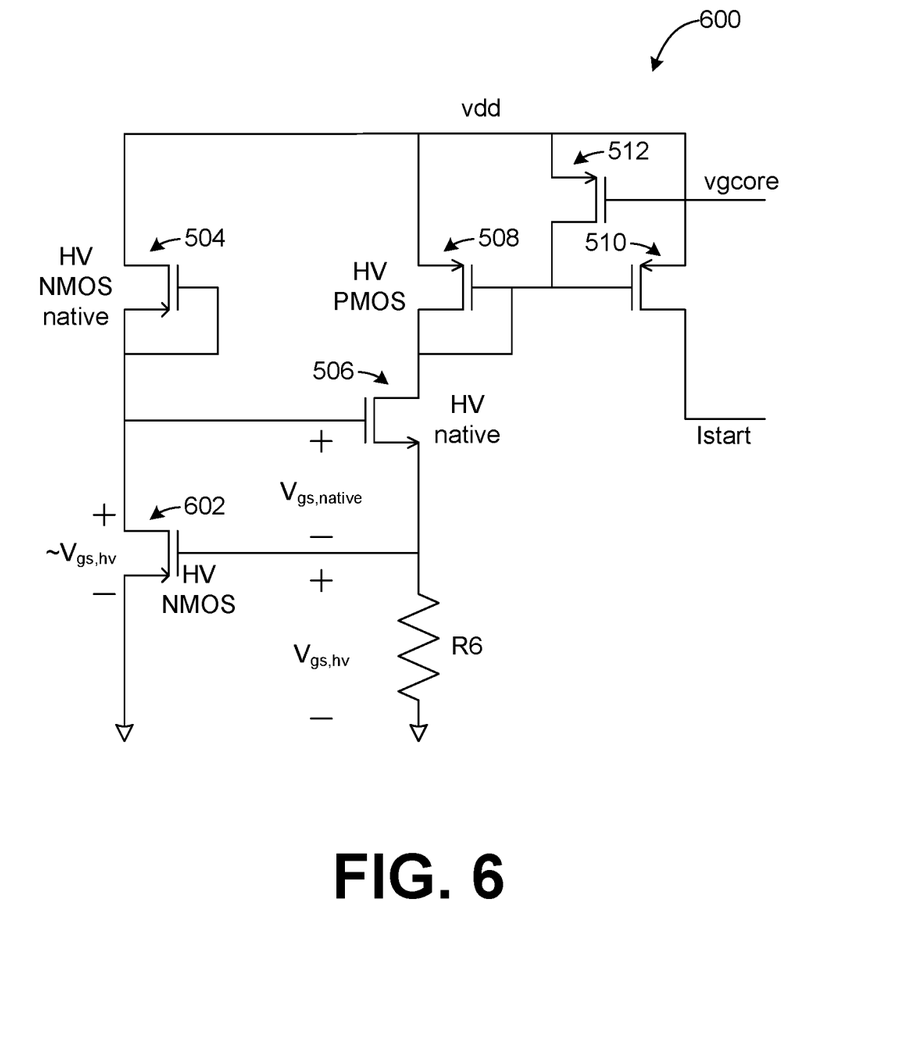
FIG. 6 illustrates another wide supply range precision startup current source.

FIG. 6 illustrates a startup circuit 600 that is similar to the startup circuit 500 of FIG. 5, except for the substitution of a high voltage transistor 602 for the low voltage transistor 502 of startup circuit 500. Referring to FIGS. 5 and 6, the gate-source voltage of transistors 502 and 602, in their respective circuits, closely approximates the gate-source voltage of transistor 504, except for the voltage offset caused by transistor 504 being a native device while transistors 502 and 602 are threshold transistors. In some embodiments of the invention, the high-voltage transistor 602 is physically fabricated to be very similar to the high-voltage native transistor 504, with the exception that the high-voltage transistor 602 additionally includes a dopant implantation in the gate area between its source and drain, while the native transistor 504 omits the implantation step in its gate area. In other respects, however, such as gate oxide thickness, the high-voltage transistor 602 is identical or very similar to the high-voltage transistor 504. They are both NMOS transistors, although in other configurations they could both be PMOS transistors. In some embodiments the transistors 504 and 602 have the same width-to-length ratios, but in other embodiments the ratios differ. Since the high-voltage transistors 504 and 602 of the startup circuit 600 are fabricated so similarly, the gate-source voltage of transistor 602 is very stable over process and operating temperature variations, as it very closely tracks the gate-source voltage of transistor 504, other than the voltage threshold offset described above. Then, the resistor R6 converts this stable voltage very linearly to a very stable electrical current, which is the desired output of the cell. Thus, by fabricating the transistors 602 and 504 similarly, other than threshold voltages, the startup circuit 600 creates a very stable output current. In the startup circuit 600 this output current is stable over process variation and operating temperature, two factors that may affect startup circuit operation in real-world devices. Such stability has previously been hard to achieve in a self-biased startup circuit. Also, although the stability of the startup circuit 600 may be better than, for instance, that of the startup circuit 500 of FIG. 5, the startup circuit 500 of FIG. 5 is much more stable than previous incarnations of other startup circuits. Remember, however, that the stability of the startup 600 comes with the added factor of a higher minimum operating voltage compared to the startup circuit 500 of FIG. 5, which uses a low-voltage transistor 502.

As used herein, the terms "about," "substantially," and "approximately," may indicate a range of values within +/−5% of a stated value. As one example of process capability, the high voltage transistors discussed above have a threshold voltage Vth of approximately 600 mV, and may operate safely with up to 3.6V across any two of their terminals. The low-voltage transistors discussed above have Vth of approximately 550 mV and may operate safely with up to 1.4V across any two of their terminals. With these example transistors, R6 may be, for example. 1.5 megohms.

Further, the native transistors are nmos transistors. However, other applications may use pmos native transistors in the above-discussed circuits.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A start-up circuit for a bandgap reference voltage generator circuit, comprising:
    a first transistor of a first type with a drain connected to a supply voltage of the bandgap reference voltage generator circuit and a source connected to its own gate, in which the first transistor has a threshold voltage less than approximately 0.5 v;
    a second transistor of the first type with a drain connected to the source of the first transistor and a gate coupled to a voltage reference resistor, the second transistor having a gate oxide thickness approximately the same thickness as the first transistor;
    a third transistor having a source connected to the voltage reference resistor, and a gate connected to a node between the first transistor and second transistor, in which the third transistor has a threshold voltage less than approximately 0.5 v, wherein raising the supply voltage of the bandgap reference voltage generator causes an electric current to flow through the reference resistor that is related to a voltage across the reference resistor; and
    a current mirror structured to duplicate the electric current flowing through the reference resistor as a startup current for the start-up circuit, wherein a startup time for supplying the start-up current is inversely proportional to a bias current of an amplifier formed by the second transistor.

2. The start-up circuit according to claim 1, in which the current mirror comprises:
    a fourth transistor with a drain connected to a drain of the third transistor and a source connected to the supply voltage of the bandgap reference voltage generator circuit; and
    a fifth transistor having a gate coupled to a gate of the fourth transistor, the fifth transistor configured to provide the start-up current for the bandgap reference voltage generator circuit.

3. The start-up circuit of claim 1, further comprising a sixth transistor configured to turn off the start-up circuit after the bandgap reference voltage generator circuit reaches an operating voltage.

4. The start-up circuit of claim 1, wherein the threshold voltage of the first transistor is approximately 0V.

5. The start-up circuit of claim 1, wherein the threshold voltage of the first and second transistors varies over a temperature of the start-up circuit.

6. The start-up circuit of claim 1, wherein the first and second transistors are n-channel MOSFET (nmos) transistors.

7. The start-up circuit of claim 1, wherein the first transistor forms a self-biased current source.

8. A start-up circuit for a bandgap reference voltage generator circuit, comprising:
    a first transistor of a first type with a drain connected to a supply voltage of the bandgap reference voltage generator circuit and a source connected to its own gate, in which the first transistor has a threshold voltage less than approximately 0.5 v;
    a second transistor of the first type with a drain connected to the source of the first transistor and a gate coupled to a voltage reference resistor, the second transistor having a gate oxide thickness approximately the same thickness as the first transistor;
    a third transistor having a source connected to the voltage reference resistor, and a gate connected to a node between the first transistor and second transistor, in which the third transistor has a threshold voltage less than approximately 0.5 v, wherein raising the supply voltage of the bandgap reference voltage generator causes an electric current to flow through the reference resistor that is related to a voltage across the reference resistor; and
    a current mirror structured to duplicate the electric current flowing through the reference resistor as a startup current for the start-up circuit, wherein, to generate the start-up current, the supply voltage is raised to approximately the threshold voltage of the second transistor.

9. A self-biased current source, comprising:
    a first transistor of a first type with a drain connected to a supply voltage and a source connected to its own gate, in which the first transistor has a threshold voltage less than approximately 0.5 v;
    a second transistor of the first type with a drain connected to the source of the first transistor, a source coupled to a reference voltage, and a gate coupled to a voltage reference resistor;
    a third transistor having a gate connected to a node between the first transistor and the second transistor, and a source coupled to the voltage reference resistor, in which the third transistor has a threshold voltage less than approximately 0.5 v, wherein raising the supply voltage causes an electric current to flow through the third transistor and through the voltage reference resistor; and
    a current mirror structured to duplicate the electric current flowing through the reference resistor as a startup current, wherein to generate the start-up current, the supply voltage is raised to approximately a threshold voltage of the second transistor.

10. The self-biased current source of claim 9, in which the second transistor has a gate oxide thickness approximately the same thickness as the first transistor.

11. The self-biased current source of claim 9, in which the threshold voltage of the first transistor is approximately 0 volts.

12. The self-biased current source of claim 9, in which the threshold voltage of the third transistor is approximately 0 volts.

13. The self-biased current source of claim 9, in which all of the first transistor, second transistor, and third transistor are n-channel MOSFET (nmos) transistors.

* * * * *